United States Patent [19]
Bertagnolli et al.

[11] Patent Number: 5,407,843
[45] Date of Patent: Apr. 18, 1995

[54] METHOD FOR MANUFACTURING LATERAL BIPOLAR TRANSISTORS

[75] Inventors: Emmerich Bertagnolli; Helmut Klose, both of Munich, Germany

[73] Assignee: Siemens Aktiengesellschaft, Munich, Germany

[21] Appl. No.: 261,142

[22] Filed: Jun. 14, 1994

[30] Foreign Application Priority Data

Jul. 2, 1993 [DE] Germany .................. 43 22 135.1

[51] Int. Cl.[6] .......................................... H01L 21/265
[52] U.S. Cl. ........................................ 437/33; 437/32; 437/917; 148/DIG. 10
[58] Field of Search ...................... 437/31, 32, 33, 28, 437/917, 909; 148/DIG. 9, DIG. 10

[56] References Cited

U.S. PATENT DOCUMENTS

| | | | |
|---|---|---|---|
| 4,545,113 | 10/1985 | Vora | 437/32 |
| 4,922,315 | 5/1990 | Vu | 257/557 |
| 5,070,030 | 12/1991 | Ikeda et al. | 437/31 |
| 5,073,506 | 12/1991 | Maszara et al. | 437/21 |
| 5,102,812 | 4/1992 | Caneau et al. | 437/32 |
| 5,164,326 | 11/1992 | Foerstner et al. | 437/59 |
| 5,273,915 | 12/1993 | Hwang et al. | 437/60 |

FOREIGN PATENT DOCUMENTS

| | | | |
|---|---|---|---|
| 0253630 | 10/1990 | Japan | 437/31 |
| 0287329 | 10/1992 | Japan | 437/917 |

OTHER PUBLICATIONS

T. Sugii et al., "A New SOI-Lateral Bipolar Transistor for High-Speed Operation", Jap. J. Appl. Phy. 30, L2080–L2082 (1991).

Primary Examiner—Brian E. Hearn
Assistant Examiner—Tuan Nguyen
Attorney, Agent, or Firm—Hill, Steadman & Simpson

[57] ABSTRACT

Method for manufacturing lateral bipolar transistors on a SOI substrate, whereby a basic doping for the conductivity type of emitter and collector is produced in the silicon layer of this SOI substrate, insulation regions are produced outside the region provided for the transistor, contact layers and dielectric layers are applied over a highly doped emitter zone and over a highly doped collector zone produced by a mask technique and are structured, so that a trench is located over a base zone to be produced and in the middle between emitter zone and collector zone, an auxiliary layer is then conformally deposited surface-wide with constant thickness, as a result whereof the trench having the width is reduced to a gap having the width of the base zone to be produced, an implantation of dopant for the operational sign of the conductivity of the base is undertaken through this gap, the regions situated laterally relative to this base zone are shielded by the vertical portions of the auxiliary layer that cover the sidewalls of the trench, via holes are then etched into the auxiliary layer and into the dielectric layer and metal contacts are produced for the electrical connection of emitter, collector and base.

4 Claims, 3 Drawing Sheets

METHOD FOR MANUFACTURING LATERAL BIPOLAR TRANSISTORS

BACKGROUND OF THE INVENTION

1. Field of the Invention

The present invention is directed generally to transistors and more specifically to a method for manufacturing lateral bipolar transistors in silicon.

2. Description of the Related Art

A layer sequence for emitter, base and collector vertically arranged above one another is standard in integrated bipolar transistors. In this vertical arrangement, two zones of the layer sequence are not directly accessible from the surface, but must be laterally lengthened and subsequently conducted to the surface. A further, highly doped buried layer is generally also necessary for the lowest, doped layer in order to keep the lead to the surface of an adequately low impedance. The actual transistor, i.e. the npn or pnp sequence of the layers is not photolithographically defined, but is defined by diffusion processes and implantations, so that dimensions in the sub-$\mu$m range can be achieved without problems. The disadvantage of this arrangement is that vertical transistors have a noteworthy depth expanse, typically 1-2 $\mu$m, and lateral dimensions that exceed the actual transistor region by a multiple. Correspondingly, there are a number of parasitic capacitances and resistances that, in addition to causing possible losses in the switching speed, noticeably increase the power consumption. In addition, the complexity of the manufacturing process and the area requirements of these components are extremely high compared to MOS components causing low yields and high manufacturing costs. The simultaneous manufacture of complementary structures (npn and pnp transistors), for example for analog applications, is possible only with substantial outlay.

Given laterally arranged bipolar transistors, the regions for emitter and collector are usually embedded in a larger base region, so that these transistors also have a relatively large expanse in depth. A simple manufacturing method for such lateral transistors is still unknown.

SUMMARY OF THE INVENTION

It is an object of the present invention to provide a method for the manufacture of lateral bipolar transistors for use in the region of optimal low power and reduced supply voltages, wherein the integration of npn and pnp transistors in one component is enabled.

The object of the present invention is achieved in a method for manufacturing a lateral bipolar transistor, having the steps of laterally electrically insulating a region provided for a transistor in a silicon layer that is located on an insulation layer, the region having a basic doping for a conductivity type of an emitter and a collector, producing a highly doped emitter zone, a highly doped base terminal zone and a highly doped collector zone by implantation of dopants using masks, applying a structured dielectric layer in between the emitter zone and the collector zone such that the dielectric layer has a trench with vertical sidewalls that extend down to the silicon layer, conformally depositing an auxiliary layer surface-wide in such a thickness to form a strip-shaped gap having a width of a base zone to be produced by the portions of the auxiliary layer thereby covering the sidewalls of the trench, producing a base zone by an implantation of dopant for a conductivity type of the base using the auxiliary layer as shielding, producing via holes for the electrical connection of the emitter zone, base terminal zone and collector zone in the dielectric layer, and applying metal contacts for the emitter, collector and base.

In the method of the invention, lateral bipolar transistors are produced in a thin silicon layer of, for example, an SOI substrate. The differently doped regions for emitter, base and collector are produced by implantation of dopant into a basic doping by using masks. An auxiliary layer is conformally deposited surface-wide in a trench in the region of a base zone to be produced. A gap having the width of the base zone to be produced is formed between the covered sidewalls of the trench. An implanting for the base zone is performed through this gap; the portions of the auxiliary layer perpendicular to the trench sidewalls serve as shielding for the adjoining regions.

A more detailed description of the manufacturing method of the present invention follows with reference to the figures.

DETAILED DESCRIPTION OF THE PREFERRED EMBODIMENTS

The method of the invention advantageously uses an SOI (silicon on insulator) substrate. Instead of an actual SOI substrate, SIMOX material or a corresponding layer structure produced by wafer bonding can also be used. A thin layer of silicon is applied on an insulating background or on an insulating intermediate layer and can be processed with the standard methods of silicon technology. The method of the invention is equally well-suited for the manufacture of both npn transistors and pnp transistors.

The region provided for the transistor in the silicon layer that, for example, can be 2 $\mu$m–20 nm thick is laterally insulated all around and has a basic doping. It is simplest when the silicon layer has a basic doping having a density of approximately $10^{15}$–$10^{17}$ cm$^{-3}$ at the beginning of the method. The operational sign of this doping is selected for the conductivity type of emitter and collector. As an example, phosphorus or arsenic is introduced as dopant for the basic doping for an npn transistor. The insulation outside of this region provided for the transistor can ensue, for example, with LOCOS or by trench etching or the like. A combination of such measures can also be considered. The silicon of the silicon layer can also be completely removed outside of this region, so that the transistor is structured in a type of mesa. In the exemplary embodiment shown in the figures, the lateral insulation regions 5 are produced with LOCOS.

Figure 1:
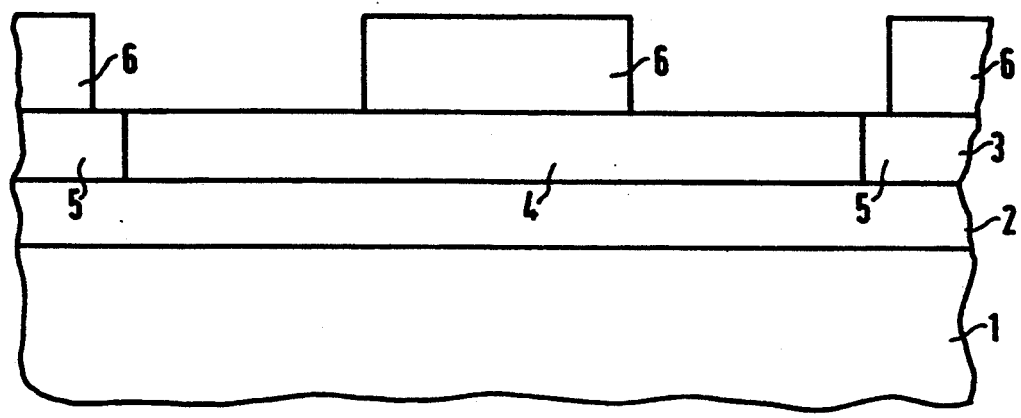
FIGS. 1-3 illustrate a manufactured transistor in cross section after various steps of the manufacturing method of the present invention.

A substrate 1, an insulation layer 2 and a silicon layer 3 are shown in FIG. 1. A region 4 provided with the basic doping and lateral insulation regions 5 are shown in cross section in the silicon layer 3. For example, the insulation layer 2 can be SiO$_2$. By using masks 6 produced, for example, with photolithography, implantings of dopants are performed for the terminal regions of an emitter, collector and base. The height of the doping is selected for a low-impedance metal-to-semiconductor contact for a subsequent electrical contacting. An emitter zone 7 and collector zone 8 shown in FIG. 2 result. The highly doped base terminal zone for the opposite operational sign is located perpendicular to the plane of the drawing. For an npn transistor, for example, boron is used as dopant for the base terminal zone. As warranted, the implanted regions are subsequently subjected to a curing and/or diffusion process (for example, RTA/FA processes). In the method of the invention, the sequence of manufacturing emitter zone and collector zone and of the base terminal zone can be interchanged.

Figure 2:
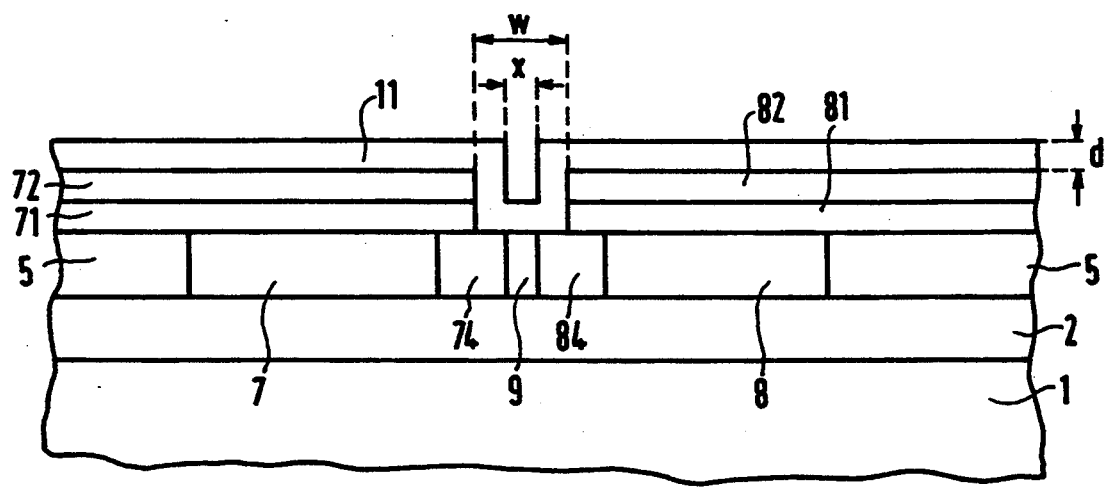

In an advantageous exemplary embodiment of the method of the invention, a polysilicon layer is then deposited for applying contact layers on the silicon over the emitter zone 7 and the collector zone 8 and is doped for the conductivity type of emitter and collector. A dielectric layer is also deposited thereon. The two deposited layers are structured as shown in FIG. 2, so that a contact layer 71 of polysilicon and a dielectric layer 72 are located on the emitter zone 7 and a contact layer 81 and a dielectric layer 82 are located on the collector zone 8. The structuring is such that according to FIG. 2, these applied layers leave a trench along the base zone to be produced free in the middle between the emitter zone 7 and collector zone 8. The sidewalls of this trench are vertical. An auxiliary layer 11 is conformally deposited surface-wide onto this structure. This auxiliary layer has a uniform thickness d. As a result thereof, a width w of the trench is reduced to a gap having a width x. The width x of this gap corresponds to the width of the base zone to be produced.

The dopant for this base zone 9 is then implanted surface-wide. The energy of this implantation is set such that the dopant unproblematically reaches the monocrystalline region of the silicon layer in the region of the gap, but in the regions to the side of the gap, is shielded by the thicker portions of the auxiliary layer 11 vertically present thereat at the trench sidewalls. Thus, only the region under the gap provided for the base zone 9 is provided with doping. The width x of the base zone 9 can be set by the width w of the trench, i.e. the spacing of the contact layers 71, 72, and via the thickness d of the deposited auxiliary layer 11. By selecting the thickness of contact layers 71, 81 and dielectric layers 72, 82, it can likewise be assured that the dopant for the base zone 9 does not reach the monocrystalline region of the silicon layer outside the region of this base zone. The base zone that is produced in this way is subsequently cured. A further emitter zone 74 having the basic doping remains between the base zone 9 and the highly doped emitter zone 7. A further collector zone 84 having the basic doping remains between the base zone 9 and the highly doped collector zone 8. The auxiliary layer 11 and the dielectric layers 72, 82 are structured such that using a phototechnique, the emitter zone 7, the collector zone 8 and the base terminal zone are provided with metal contacts, potentially via contact layers 71, 81 applied thereon. A contact layer of polysilicon can likewise be applied on the base terminal zone 9. This contact layer of polysilicon is capable of being applied together with the contact layers 71, 81 for emitter and collector but having to be oppositely doped.

Figure 3:
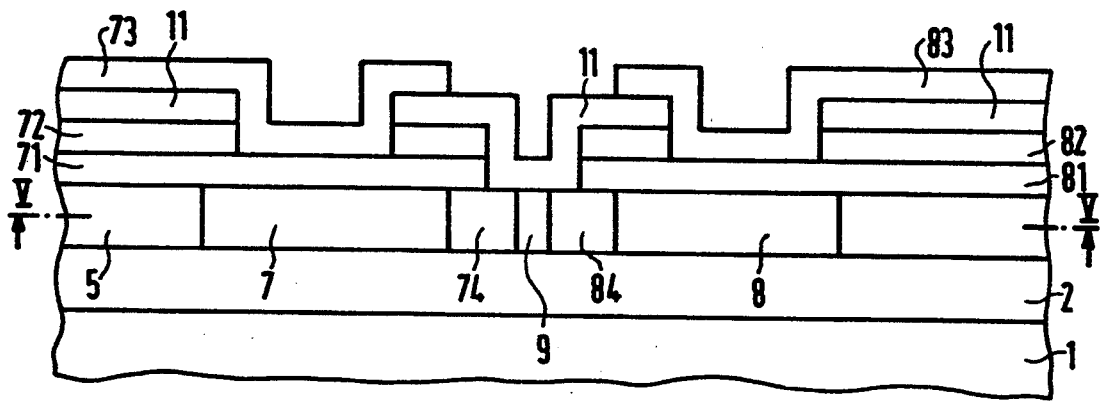
Figure 4:
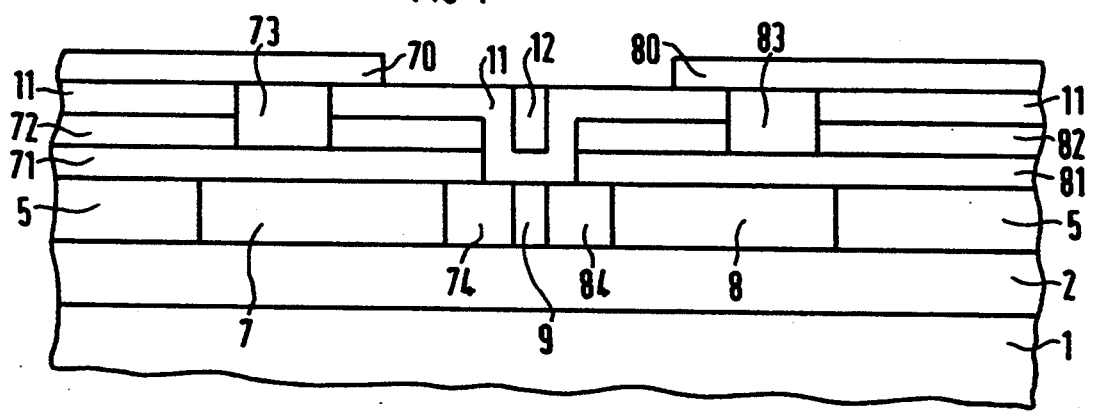
FIG. 4 illustrates an embodiment of a transistor in cross section manufactured by the method of the present invention.

FIG. 3 shows a cross section through the finished transistor with the applied metal contacts 73, 83 for the emitter and, respectively, the collector. Instead of these metal contacts, each via hole can first be filled with the metal contact, as shown in FIG. 4, and a connection metallization 70, 80 can then be applied on the surface, for example, as a component part of interconnects. The gap in the auxiliary layer 11 located above the base zone 9 can be filled, for example, by deposition of a dielectric 12. This is possible in all of the shown embodiments.

Figure 5:
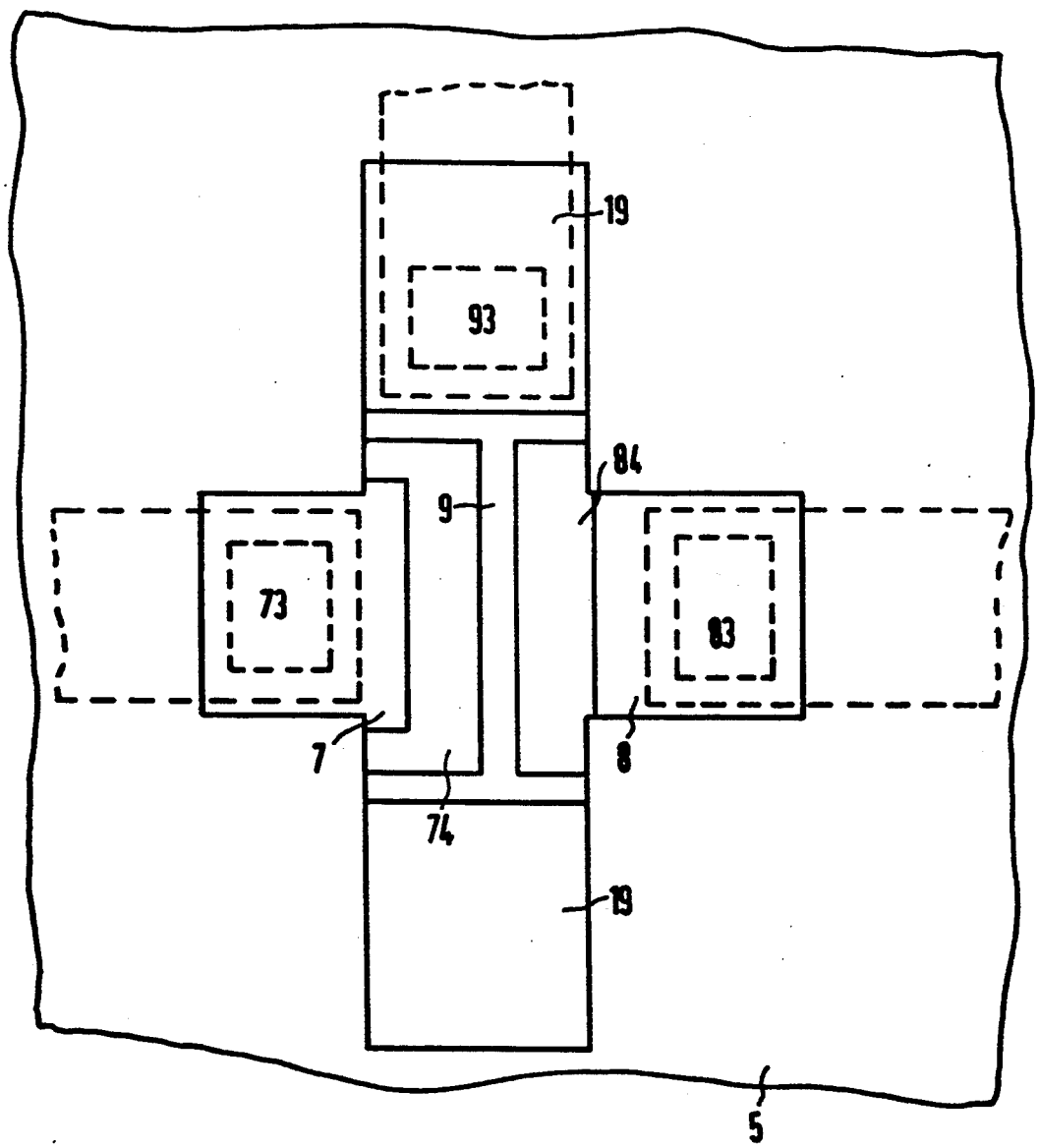
FIG. 5 illustrates the section of the invention shown in FIG. 3.

The section shown in FIG. 3 is illustrated in FIG. 5. The arrangement of the emitter zone 7, the collector zone 8, the base zone 9 and the base terminal zone 19 connected thereto are shown FIG. 5. The contours of the metal contacts 73, 83, 93 applied onto these zones are shown with broken lines.

Figure 6:
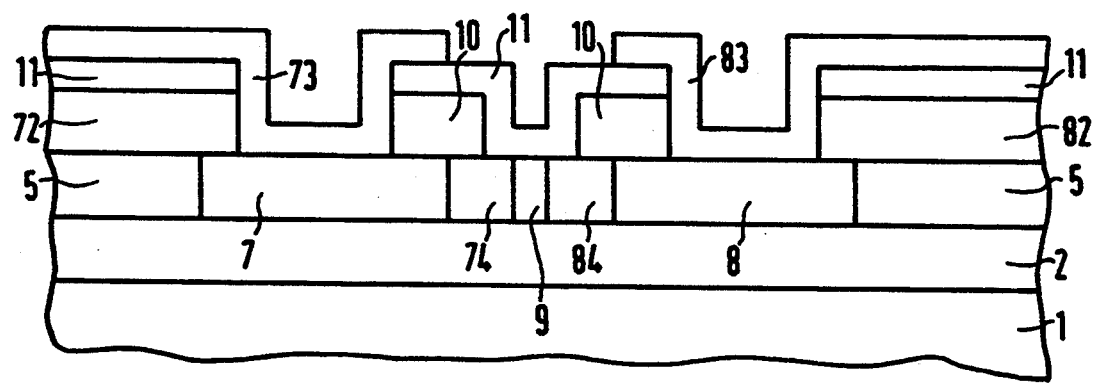
FIG. 6 illustrates an embodiment of a transistor in cross section manufactured by the method of the present invention.

A layer of tungsten/TiN or other refractory metals, metal compounds or polycides (compounds of metal with polysilicon) can also be used instead of polysilicon as contact layers 71, 81 in the method of the invention. In this case, the first metallization level can be completely implemented with these materials, so that two photolithography steps (via hole and first metallization level) are eliminated. The contact layer can also be entirely foregone when the emitter zone, the collector zone and the base terminal zone are directly contacted to the first metallization level after the production of the diffusion regions. In this case, the dielectric layer 72, 82 (for example, SiO$_2$) are directly deposited onto the emitter zone 7, the collector zone 8 and the base terminal zone 19 according to FIG. 6. This dielectric layer 72, 82 is potentially applied correspondingly thicker than in the above-described exemplary embodiment. The trench over the base zone to be produced is produced in the middle between the emitter zone 7 and the collector zone 8 in this dielectric layer using a phototechnique. Subsequently, the auxiliary layer 11 is conformally applied surface-wide, i.e. with uniform thickness, so that the gap over the base zone 9 through which the doping is introduced into the base zone 9 remains. The via holes are then etched down to the emitter zone 7, the collector zone 8 and the base terminal zone 19, so that the metal contacts 73, 83 can be directly applied onto these highly doped regions of the original silicon layer, as shown in FIG. 6.

The width w of the trench over the base zone can be selected in conformity with the minimum resolution of the phototechnique. The distance between the contactings of emitter and collector is established by this slight width w. Given a suitable selection of the thickness D of the auxiliary layer 11, the base zone can be set extremely narrow. Lateral bipolar transistors with extremely small dimensions can therefore be manufactured symmetrically and self-aligned in a simple way with the method of the invention.

It should be understood that various changes and modifications to the presently preferred embodiments described herein will be apparent to those skilled in the art. Such changes and modifications may be made without departing from the spirit and scope of the present invention and without diminishing its attendant advantages. It is, therefore, intended that such changes and modifications be covered by the appended claims.

We claim:

1. Method for manufacturing a lateral bipolar transistor, comprising the steps of:

laterally electrically insulating a region provided for a transistor in a silicon layer that is located on an insulation layer, said region having a basic doping for a conductivity type of an emitter and a collector;

producing a highly doped emitter zone, a highly doped base terminal zone, and a highly doped collector zone by implantation of dopants in said silicon layer using masks;

applying a structured dielectric layer over said silicon layer between said emitter zone and said collector zone such that said dielectric layer has a trench with vertical sidewalls that extend down to said silicon layer;

conformally depositing an auxiliary layer surface-wide over said structured dielectric layer with a thickness to form a strip-shaped gap, having a width of a base zone to be produced, by portions of said auxiliary layer covering the sidewalls of said trench;

producing a base zone by an implantation of a dopant in said silicon layer for a conductivity type of said base using said auxiliary layer as shielding;

producing via holes through said auxiliary layer and said dielectric layer respectively exposing said emitter zone, base terminal zone, and collector zone; and applying metal electrical contacts in said via holes for said emitter, collector and base.

2. Method according to claim 1, further comprising the step of:

applying contact layers onto said emitter zone and said collector zone before applying said structured dielectric layer, said contact layers being structured conforming to said dielectric layer.

3. Method according to claim 2, wherein said step of applying contact layers onto said emitter zone and said collector zone is further defined by applying polysilicon contact layers.

4. Method according to claim 2, wherein said step of applying contact layers onto said emitter zone and said collector zone is further defined by applying contact layers composed of a refractory material selected from the group consisting of: metals, metal compounds and a polycide.

* * * * *